(12) United States Patent
Moriconi et al.

(10) Patent No.: US 6,798,269 B2
(45) Date of Patent: Sep. 28, 2004

(54) BOOTSTRAP CIRCUIT IN DC/DC STATIC CONVERTERS

(75) Inventors: Ugo Moriconi, Dalmine (IT); Claudio Adragna, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/337,935

(22) Filed: Jan. 6, 2003

(65) Prior Publication Data

US 2003/0151447 A1 Aug. 14, 2003

Related U.S. Application Data

(63) Continuation-in-part of application No. 09/912,073, filed on Jul. 24, 2001, now abandoned.

(30) Foreign Application Priority Data

Jul. 25, 2000 (IT) ...................................... MI2000A1691

(51) Int. Cl.[7] .............................................. H03K 17/16
(52) U.S. Cl. ...................................... 327/390; 327/536
(58) Field of Search ................................ 327/109, 112, 327/390, 536; 363/59

(56) References Cited

U.S. PATENT DOCUMENTS

| | | | | |
|---|---|---|---|---|
| 4,447,745 A | * | 5/1984 | Takemae et al. | ............ 327/292 |
| 5,084,634 A | * | 1/1992 | Gorecki | ......................... 327/91 |
| 5,381,044 A | * | 1/1995 | Zisa et al. | .................... 327/109 |
| 5,592,115 A | * | 1/1997 | Kassapian | ..................... 327/239 |
| 5,672,992 A | * | 9/1997 | Nadd | ............................ 327/390 |
| 5,883,547 A | * | 3/1999 | Diazzi et al. | ................. 327/589 |
| 5,917,348 A | * | 6/1999 | Chow | ............................ 327/108 |
| 6,118,326 A | * | 9/2000 | Singer et al. | ................ 327/390 |
| 6,130,574 A | * | 10/2000 | Bloch et al. | .................. 327/536 |
| 2003/0090311 A1 | * | 5/2003 | Pan et al. | ..................... 327/390 |

* cited by examiner

Primary Examiner—Terry D. Cunningham
(74) Attorney, Agent, or Firm—Lisa K. Jorgenson; Stephen Bongini; Fleit, Kain, Gibbons, Gutman, Bongini & Bianco P.L.

(57) ABSTRACT

A bootstrap circuit in DC/DC static converters is provided that includes a power transistor having a first non drivable terminal coupled with a first input voltage and driving means connected with a drivable terminal of the power transistor and adapted for determining the on time and the off time of the power transistor for each prefixed switching time period. The bootstrap circuit includes a capacitor coupled respectively with the second non drivable terminal of the power transistor and with a second input voltage and an input of the driving means so that the voltage between its terminals is substantially equal to the voltage between the second non drivable terminal and the drivable terminal during the off time of the power transistor. The bootstrap circuit includes an overcharge circuit arranged between the second non drivable terminal and ground; the overcharge circuit is able to allow overcharging the capacitor during the off time of the power transistor and for a time period lower than the off time.

22 Claims, 3 Drawing Sheets

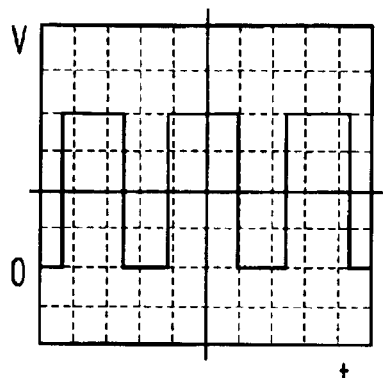
FIG. 3
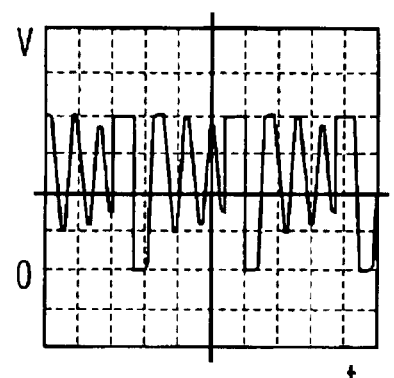
FIG. 4
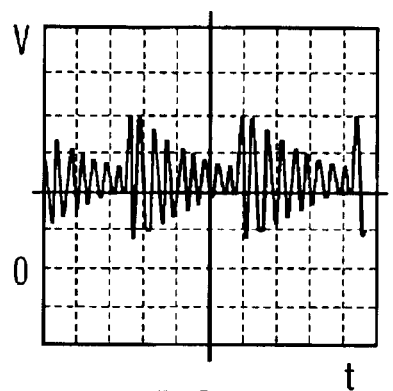
FIG. 5
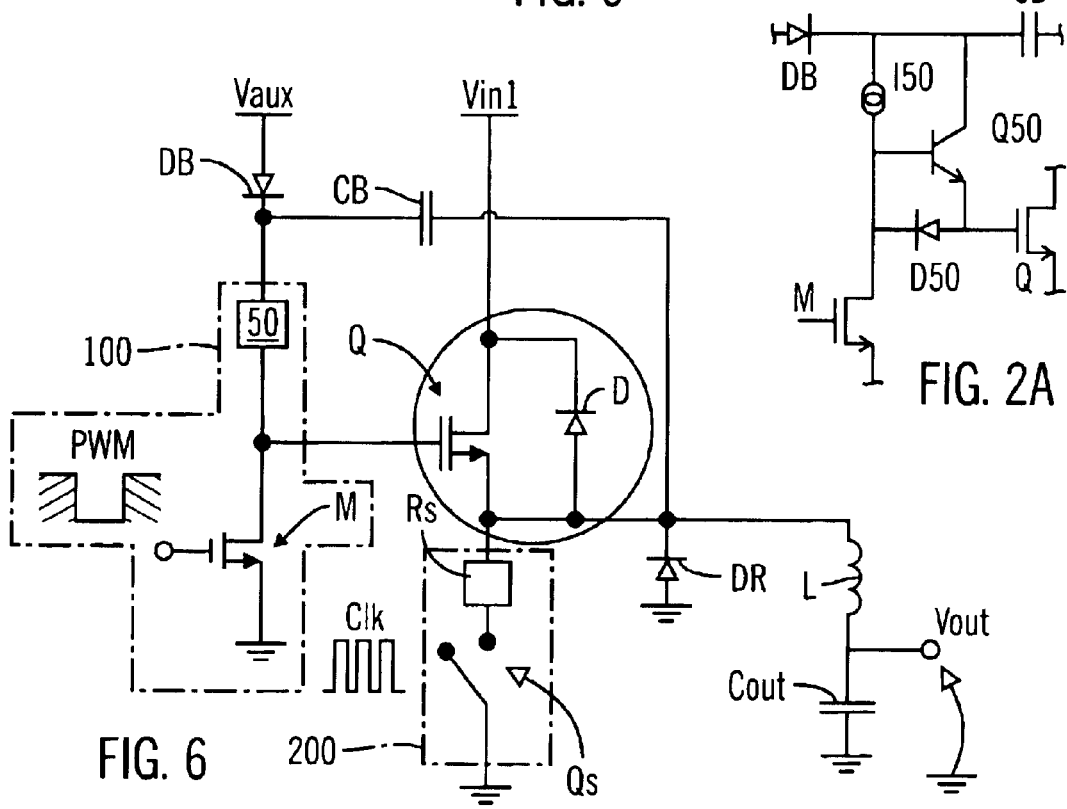
FIG. 6
FIG. 2A

BOOTSTRAP CIRCUIT IN DC/DC STATIC CONVERTERS

CROSS-REFERENCE TO RELATED APPLICATIONS

This is a continuation-in-part of U.S. application Ser. No. 09/912,073, filed Jul. 24, 2001, now abandoned. The entire disclosure of prior application Ser. No. 09/912,073 is herein incorporated by reference.

Additionally, this application is based upon and claims priority from prior Italian Patent Application No. MI2000A 001691, filed Jul. 25, 2000, the entire disclosure of which is herein incorporated by reference.

BACKGROUND OF THE INVENTION

1. Field of the Invention

The present invention refers to a bootstrap circuit in DC/DC static converters, particularly in DC/DC static converters in step-down configuration. The present invention finds particular application in static converters wherein a bootstrap circuit is used to drive a MOSFET in high side configuration.

2. Description of Related Art

DC/DC static converters are widely used in power supplies, actuator systems, displays, signal processing systems etc. and are based on well-known circuit topologies wherein a magnetic means, such as a transformer or an inductance, is driven by at least one power switch. The switches are controlled by a Pulse Width Modulation (PWM) system commutating at a certain frequency set by a system timing signal.

In the field of static converters there are various circuit topologies, such as step-down converters, also known as "buck" converters, in which the regulated output voltage is less than the input voltage, step-up converters, also known as "boost" converters, in which the regulated output voltage is greater than the input voltage and the converters called "buck-boost" in which the regulated output voltage has an inverse sign compared to the input voltage.

In the configuration of the step-down converter illustrated in FIG. 1, the power switch is represented by an N-channel DMOS transistor Q1 in high-side configuration, that is a configuration in which the source terminal is not connected to a fixed potential circuit point. The source voltage of the DMOS Q1 can vary between a voltage Vin, which is the input voltage of the converter, when the DMOS Q1 is on and forces current in an inductance L1 (which is connected with the output terminal of the converter and to ground through a capacitor C1) and a voltage −Vd, which is the voltage drop on the freewheeling diode DR1 when the DMOS Q is off and the current stored in the inductance L1 flows through the diode DR1. A graph is shown in FIG. 3 which shows the waveform of the voltage at the source terminal of the DMOS Q1 when a load connected to the output of a circuit in FIG. 1 is at the maximum values.

It is well known to a technician in the sector that in order an N-channel DMOS transistor to be well on (that is its channel resistance Rdson is minimized), the voltage difference between the gate terminal and the source terminal of the DMOS is higher than about 10V. When the DMOS is well on, that is when it operates deeply in the resistive region, the voltage of the source terminal is about equal to the input voltage, apart from the voltage drop due to the resistance of the DMOS itself. This implies the needs of having a floating gate drive block 300, with which in the circuit in FIG. 1 the gate terminal and the source terminal of the transistor Q1 are connected, that is a circuit able to permit that the voltage at the gate terminal follows the voltage at the source terminal. Also it is necessary to have a voltage available which exceeds the input voltage by about 10 V. A widely diffused technique to form a floating gate drive circuit and in the same time to obtain the extra voltage is the so-called bootstrap technique; the bootstrap technique applied to a DMOS high-side of a DC/DC static converter in buck configuration is shown in FIG. 2.

The limit of this circuit solution is that the DMOS cannot be kept on for an indefinitely long tine and above all that a minimum time has to be guaranteed during which, while the magnetic means, that is the inductor, demagnetises, the potential of the source terminal is sufficiently near to zero so that a bootstrap capacitor CB is recharged.

The need of quickly recharging the capacitor is a pressing problem from the technological point of view when the DC/DC converter operates with low loads (that is loads changing from ½0 to ¹⁄100 of the nominal load) because one or more of the following issues can occur.

a) When the converter has a low load both the on time of the DMOS and the conduction time of the freewheeling diode are very short and the voltage at the source terminal of the transistor has the waveform as shown in FIG. 4. This means that if the load is sufficiently low the conduction time of the diode can become so short that it does not enable the capacitor to be fully recharged.

b) The DMOS cannot be on for less than a minimum time because of the delays of the control circuit. When the load is very low and requires the DMOS to be on for a time shorter than the allowed minimum time, since this is not possible, in the short time an excess of energy is brought onto the load with a resulting slight increase of the output voltage. The feedback control loop reacts and several switching cycles may be skipped so as to bring the output voltage back to the regulated value and re-establish the correct energy balance. In this case, therefore, the time available for recharging the bootstrap capacitor disappears.

c) If the input and output voltages are relatively high (both exceeding around ten Volts) and near to one other, the voltage forced in the inductor during the time in which the DMOS is on can be so low that the demagnetization of the inductor does not use all the energy stored in the parasitic capacitance of the source terminal. When this occurs, the voltage at the source terminal remains several Volts above zero, as shown in FIG. 5, the freewheeling diode is not switched on, and the bootstrap capacitor is little recharged or not recharged at all.

The result of the previously described phenomena is that the bootstrap capacitor is progressively discharged and as soon as its voltage goes below the threshold voltage of the DMOS transistor, the transistor cannot be turn on again and the converter will be blocked. According to the values of the input and output voltages and to the values of the components used in the converter, an intermittent functioning or a definitive block of the converter will be obtained.

This can be seen also during converter power-off at very low load: if the output voltage is relatively high (that is it overcomes ten Volts) the input voltage will diminish very slowly and when it approaches the output voltage it falls into condition (c). The result is that the output voltage does not go to zero monotonically but oscillating. The U.S. Pat. No. 5,627,460 discloses how to use the technique of the so-called "synchronized diode" applied to a DC/DC converter step-down in which the freewheeling diode is replaced by an N-channel DMOS in low-side configuration that is driven in push-pull with respect to the main DMOS. Such a solution is not applicable to the standard buck topology because the latter has the freewheeling diode and not two MOSFET's synchronized in push-pull.

The International Rectifier in one of its application notes (DT94-1A "Keeping the bootstrap capacitor charged in buck converts") concerning its device IR2125, suggests applying a resistor and a Zener diode. This technique is effective when the input voltage is quite higher than the output voltage and therefore it is not applicable in the case (c). In addition, if the input voltage has a wide-range variation, to be able to guarantee sufficient current at the minimum input voltage a relatively low resistive value is necessary which leads, when the input voltage is high, to high power dissipation in the resistance and in the Zener.

Other known solutions resort to magnetic means but have the disadvantage that when the load of the converter has a low value the magnetic energy is also very low, comparable to or lower than that dissipated by the effect of the not-ideal coupling between the windings, with consequent loss of effectiveness.

SUMMARY OF THE INVENTION

In view of the state of the art, the object of the present invention is to provide a circuit suitable for avoiding the discharge of the bootstrap capacitor so as to permit more effective driving of the DMOS in high-side configuration.

In accordance with a preferred embodiment of the present invention, there is provided a bootstrap circuit in DC/DC static converters comprising a power transistor having a first non drivable terminal coupled with a first input voltage and driving means connected with a drivable terminal of the power transistor and adapted for determining the on time and the off time of the power transistor for each prefixed switching time period, the bootstrap circuit comprising a capacitor coupled respectively with a second non drivable terminal of the power transistor and with a second input voltage and an input of the driving means so that the voltage between its terminals is substantially equal to the voltage between the second non drivable terminal and the drivable terminal during the off time of the power transistor, an overcharge circuit arranged between the second non drivable terminal and a reference voltage, the overcharge circuit being able to allow overcharging the capacitor during the off time of the power transistor and for a time period lower than the off time.

Thanks to the present invention it is possible to form a circuit capable of eliminating the problems connected to the bootstrap technique.

In addition it is possible to form a circuit that permits the turning on of a DMOS high-side for an undetermined time.

The present invention finds application also in other circuit topologies of static converters such as the "buck-boost", the "flyback", the two-switch "forward", the half-bridge and the full-bridge. The last two are used also for motor control.

BRIEF DESCRIPTION OF THE DRAWINGS

The characteristics and the advantages of the present invention will appear evident from the following detailed description of an embodiment thereof, illustrated as non-limiting example in the enclosed drawings, in which:

FIG. 2a is an example of implementation of the floating gate-drive circuit in FIG. 2;

FIG. 3 shows a typical waveform of the circuit in FIG. 1 in the case of maximum load;

FIG. 4 shows a typical waveform of the circuit in FIG. 1 in the case of low load;

FIG. 5 shows a typical waveform of the circuit in FIG. 1 in the case of extremely low load;

FIG. 6 shows a bootstrap circuit according to a preferred embodiment of the present invention which is applied to a DMOS high-side of a DC/DC static converter in buck configuration;

DETAILED DESCRIPTION OF PREFERRED EMBODIMENTS

Figure 1:
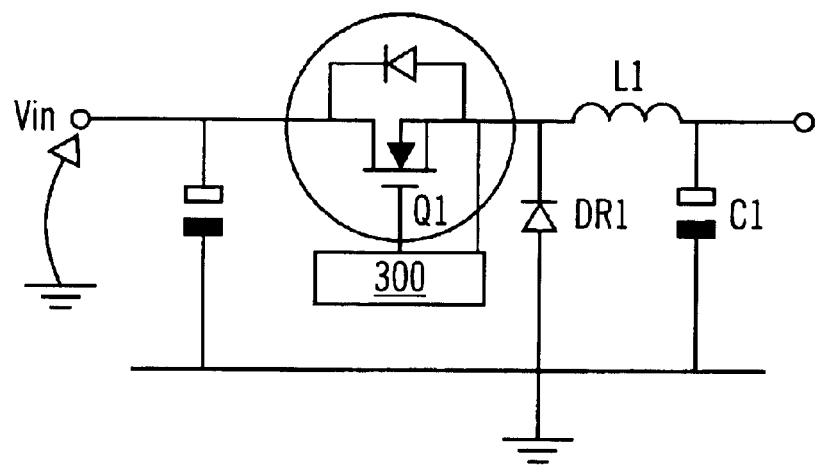
FIG. 1 shows a conventional DC/DC static converter in buck configuration with power switch in high-side configuration.
Figure 2:
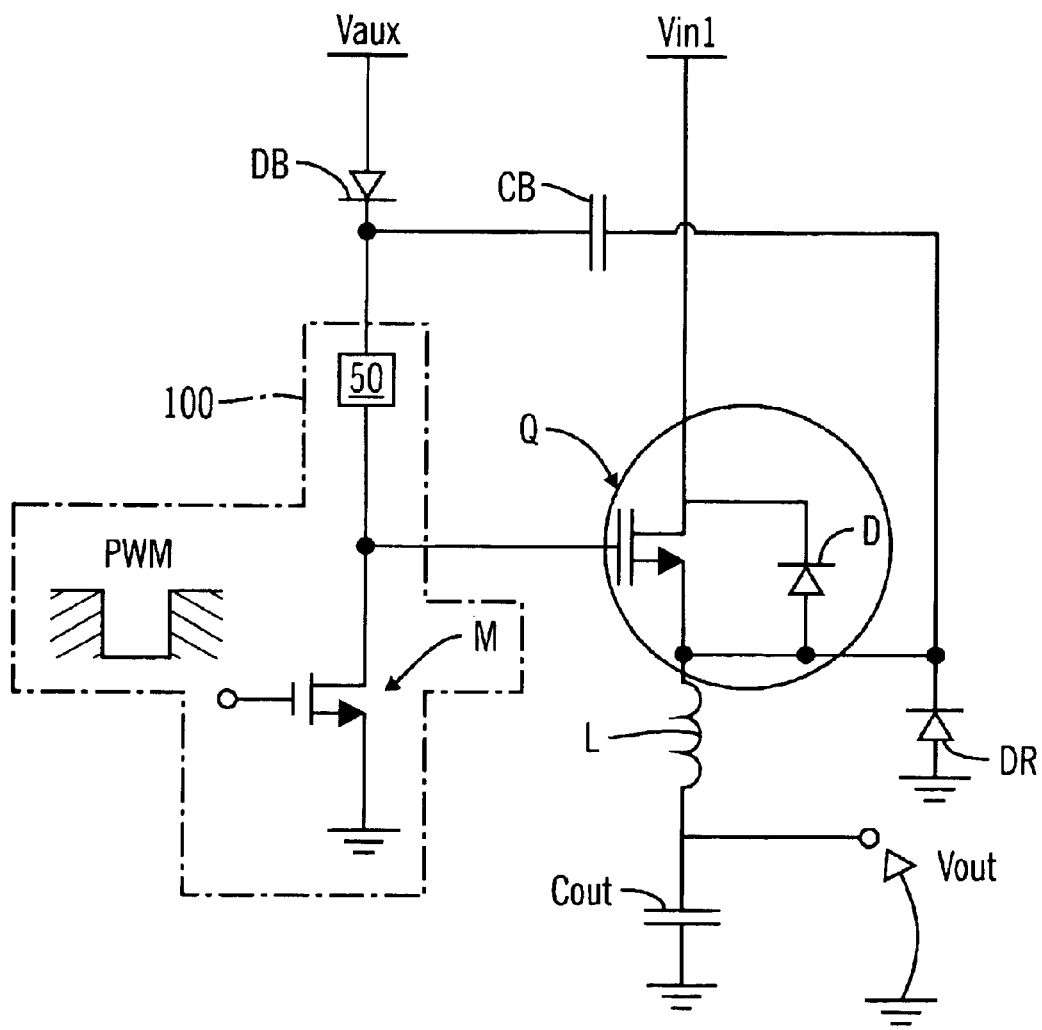
FIG. 2 shows schematically the bootstrap technique applied to a DMOS high-side of a DC/DC static converter in buck configuration.

In FIG. 2, a circuit is schematically shown that uses the bootstrap technique applied to a DMOS high-side of a DC/DC static converter in buck configuration, according to the known technique.

According to what is illustrated in the Figure a power transistor Q, for example a DMOS with its inherent body diode D, can be noted which ha a non-drivable terminal, that is the source terminal, connected with an inductance L in turn connected with an output capacitor Cout connected to ground. The source terminal is also connected with a cathode terminal of a freewheeling diode DR having its anode terminal connected to ground. An output voltage of the circuit, called Vout, is set at the terminals of the capacitor Cout. Another non-drivable terminal of the transistor Q, that is the drain terminal, is connected to a first supply line or input voltage Vin1, while the gate terminal of the DMOS Q is connected with driving means 100 adapted for determining the on time Ton and the off time Toff of the power transistor Q for each prefixed switching period T.

The driving means 100 comprises a floating gate-drive circuit 50 made with any known technique and which drives the gate terminal even if the source terminal is not connected to a fixed potential circuit point, and a signal transistor M of the MOSFET type. The transistor M has its source terminal connected to ground, the drain terminal connected with the gate terminal of the DMOS Q and the gate terminal is driven by means of a PWM type signal. The last is generated with a known technique by means of a combination of a sawtooth signal generator and a modulating signal compared by a comparator so as the PWM signal to be low (so that the transistor Q is turned on) only during the ramp-up of the sawtooth signal and to be definitely high (so that the transistor Q is definitely off) during the ramp-down of the sawtooth signal.

The floating gate drive circuit 50 is supplied by a second supply line or input voltage Vaux (usually derived from Vin 1 via a linear regulator and wherein Vaux is preferably of about 10V) through a diode DB whose anode is connected with Vaux and the cathode is connected with the floating gate drive circuit 50 and a terminal of a capacitor CB.

In FIG. 2a, an example of implementation of the floating gate-drive circuit 50 is shown. The floating gate-drive circuit 50 comprises a current generator 150 connected between the cathode of the diode DB and the source terminal of the transistor M, a diode D50 having its cathode connected with the source terminal of the transistor M and the anode connected with the gate terminal of the transistor Q, and a bipolar transistor Q50 having the collector terminal connected with the cathode of the diode DB, the emitter terminal connected with the gate terminal of the transistor Q and the base terminal connected with the cathode of the diode D50.

The capacitor CB has the other terminal connected with the source terminal of the DMOS Q. The capacitor CB is the element suitable for storing the charge, which in combination with the second supply Vaux, permits the circuit shown in the Figure to keep the DMOS Q well on and therefore to minimize its channel resistance Rdson.

When the transistor M is turned on, the floating gate-drive circuit keeps the transistor Q in off state and the diodes DR and DB are together on. Therefore the voltage at the terminals of the capacitor CB is set at: $VCB=Vaux-V_{DB}+Vd$ with $V_{DB}$ voltage drop at the terminals of the diode DB when it is forward biased and Vd is the drop voltage at the terminals of the diode DR when it is forward biased. In the circuit of FIG. 2a the base terminal of the transistor Q50 is forced to ground while its emitter voltage is at about 0.7 V above ground; therefore the transistor Q50 is in off state. The voltage at the gate terminal of the transistor Q is about 0.7 V and the voltage at the source terminal is about −0.7V; the gate-source voltage is about 1.4V that is it is under the turning on threshold voltage of the transistor Q which is of about 4 V.

Vice versa, when the transistor M is turned off, the floating gate drive circuit 50 connects the capacitor CB between gate and source terminals of the DMOS Q. In fact, considering the floating gate drive circuit 50 of FIG. 2a, the transistor Q50 is on and the terminal of the capacitor CB, which is connected with the collector terminal of the bipolar transistor Q50, is brought substantially to the same voltage of the gate terminal of the transistor Q. In fact, since the transistor M is turned off, the current 150 flowing into the base of the transistor Q50 turns it on; the potential of the emitter terminal of the transistor Q50 will rise to until the difference between the collector and emitter terminals is the voltage across the diode D50 and the voltage across the current generator 150 approaches zero so that the base and the collector terminal will have the same voltage. The gate-source voltage of the transistor Q is given by: $V_{GS}=VCB-Vbe50$ wherein the voltage VCB is the voltage across the capacitor CB and the voltage Vbe50 is the voltage between the base and emitter terminals of the transistor Q50; the voltage VCB is much higher than the voltage Vbe50 (the voltage VCB is almost equal to the voltage Vaux, as above described) and therefore the gate-source voltage is substantially equal to the voltage VCB. Actually, as the capacitor CB is connected between the gate and source terminals of the transistor Q, the voltage across the capacitor CB undergoes a sudden drop because of the charge transferred from the capacitor CB to the gate equivalent capacitor. Therefore the value of the capacitor CB must be much higher than the equivalent gate capacitance to minimize this voltage drop. As a result, the transistor Q will be turned on, then the voltage V(S) at the source terminal of the transistor Q will rise until it is very close to the voltage Vin; the voltage at the gate terminal will rise as well dragged by the capacitor CB and go above Vin1 so that the diode DB will be reverse-biased.

A bootstrap circuit according to present invention which is applied to a DMOS high-side of a DC/DC static converter in buck configuration is shown in FIG. 6.

The bootstrap circuit in the FIG. 6 differs from the bootstrap circuit in FIG. 2 for the addition of an overcharge circuit 200 to the devices already described in FIG. 2. The overcharge circuit comprises a series of a switch Qs and a resistive means Rs which is connected between a non-drivable terminal of the transistor Q, that is the source terminal, and a reference voltage, preferably ground. The turning on and off of the switch Qs is controlled by a time signal at fixed frequency properly synchronized to the signal that drives the transistor M.

The switch Qs is preferably a MOSFET transistor or a bipolar transistor with the source (emitter) grounded and the drain (collector) connected with a terminal of the capacitor CB by means of the resistive means Rs. The resistive means Rs can be the on resistance Rdson of the MOSFET itself and no additional component is required.

The resistive means Rs is a resistance that limits both the charge current of CB and the current peak for the fact that, even though for a very short time, there may be contemporary conduction (cross-conduction) of the transistors Q and Qs.

It is to be noted that, if the switch is formed by a transistor of MOSFET type, the cross-conduction issues would be considerably reduced.

The value of the resistance Rs is not critical, nevertheless it cannot be too low, as there could be high current peaks, but not too high either, as the discharge constant of CB would be too long. The Applicant has found that the values included in a range from 10 to 100 Ohm, which depend on the values of the input voltage Vin1 and the output voltage Vout, are suitable.

The overcharge circuit 200 is adapted for permitting to overcharge the capacitor CB during the off time Toff of the power transistor Q and for a time period Tc lower than the off time Toff; the time period occurs close to the end of the off time Toff.

Figure 7:
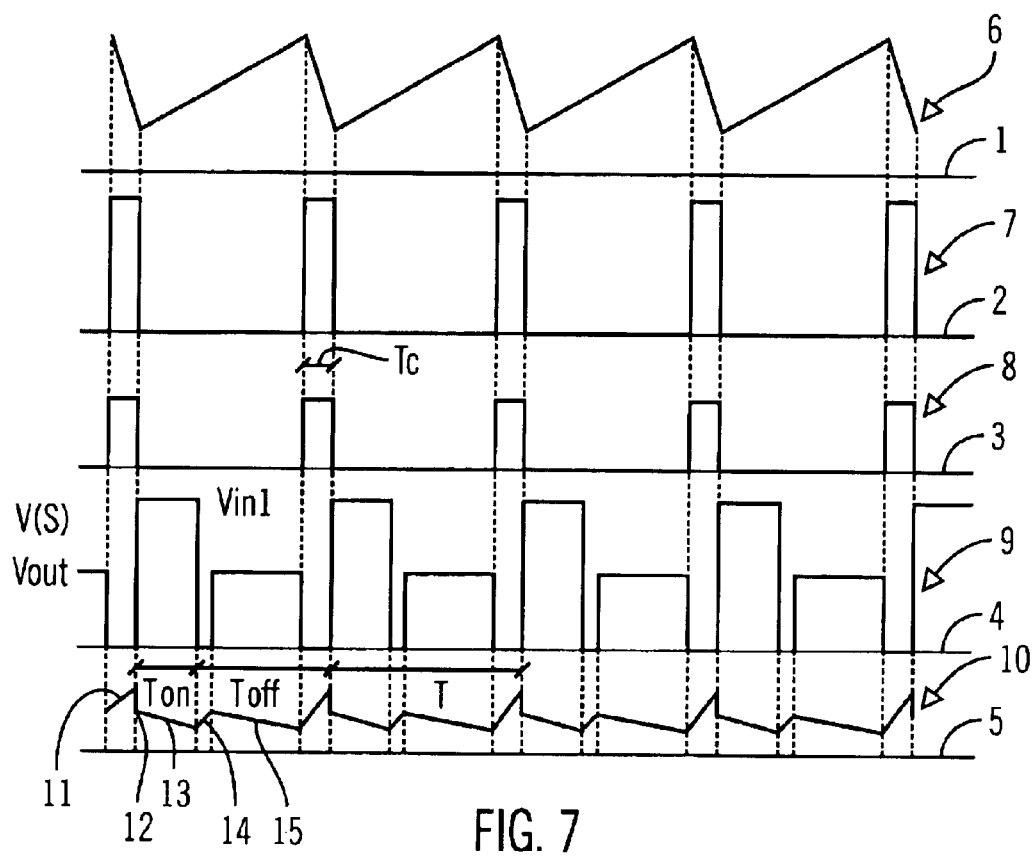
FIG. 7 shows a set of time diagrams of the different signals used in the circuit in FIG. 6.

The operating principle of the circuit of FIG. 6 can be explained with the aid of the time diagram shown in FIG. 7 which comprises a plurality of voltage graphs 6–10 in function of a plurality of respective tine axes 1–5.

Graph 6 shows the sawtooth signal generated by the local oscillator that determines the operating frequency of the converter. When the sawtooth signal is ramping down (with the transistor Q definitely off) the same oscillator generates clock pulses 7 at the end of which the transistor M is off and the transistor Q is on. In some devices available in the market these pulses are made externally accessible to enable synchronization of more converters. Graph 8 shows the signal applied to the gate terminal of the transistor Qs, which is synchronized to and which has the same pulse duration of the clock signal 7; graph 9 shows the voltage V(S) at the source terminal of the transistor Q and graph 10 shows the course of the voltage across the capacitor CB.

In particular from graph 10 it can be inferred that the capacitance CB undergoes an overcharge phase II while the transistor Qs is on and the source voltage of the transistor Q is forced to zero in the tune period Tc; this brings the voltage on the capacitor CB to its maximum value. Successively there are a steep but brief discharge phase 12 due to the discharge of the capacitor CB on the equivalent capacitor of the gate terminal of the transistor Q, a further discharge phase 13 during the on time Ton of the transistor Q because of an internal consumption of the circuit, a charge phase 14 during the freewheeling diode conduction (which would be only the charge phase without the circuit 200), and a discharge phase 15 during the remainder of the off time of the transistor Q, because of the internal consumption of the circuit. As can be inferred from graph 10 the charge/discharge phases of the capacitor CB are periodically repeated in time, because the charge/discharge operations are controlled by a signal at fixed frequency.

It is evident in the waveform 9 the action of the overcharge circuit that forces the source voltage of the transistor Q to go low (the part of the graph 9 corresponding to the phase 11 in graph 10) during a time in which the same transistor Q is off and the corresponding beneficial action on the charge of the capacitor CB: the recharge time 14 due to the conduction of the diode DR alone would be too small to full replenish the capacitor CB.

Figure 8:
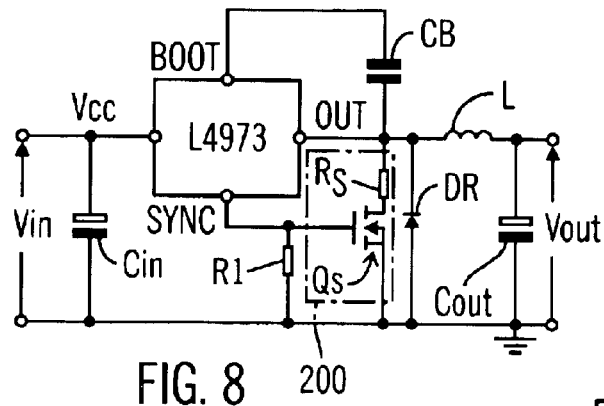
FIG. 8 shows an example of the present invention applied to a device.

An example of the application of the present invention is shown in FIG. 8 in which a device produced and marketed by the Assignee of the present invention and known by the part number L4973, (ref "Application Note 938, Designing With L4973, 3.5A High Efficiency DC-DC Converter, STMicroelectronics") is used. Four output pins of this device are represented and in particular the pin Vcc, the pin BOOT, the pin OUT and the pin SYNC. In addition the presence of a resistance R1 can be noted, which ensures a relatively low-impedance path from gate to ground to prevent any accidental turn-on of the transistor Qs, an input capacitor Cin, and the freewheeling diode DR.

The pin SYNC makes the clock pulses inside the integrated circuit available and generally it is used to synchronize another device if present. In this embodiment the synchronization pulses represent the fixed frequency signal (graph 6) in FIG. 7, and therefore the synchronization signal gives the command to the MOS Qs to regenerate the charge of the capacitor CB.

The resistor Rs basically limits the charge current of the capacitor CB; the cross-conduction of the transistors Q and Qs is in this case negligible because MOSFETS do not have storage time and are turned off with only few nanosecond delay.

Figure 9:
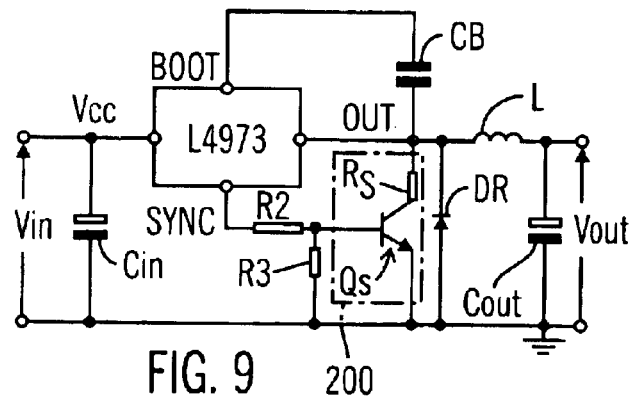
FIG. 9 shows another example of the present invention applied to the same device.

A further application example of the present invention is shown in FIG. 9 in which the device L4973 produced and marketed by the Assignee can be noted, having a bipolar transistor Qs with a limitation resistance Rs and two resistances R2 and R3 connected on the pin SYNC in order to drive the bipolar Qs in current.

The functioning of the circuit illustrated in the Figure is similar to that of FIG. 8 with the specification that the resistance Rs, as well as limiting the charge current of CB, also serves to limit the current peak due to the fact that, even though for a very brief period, there is a contemporary conduction of the DMOS Q inside the integrated L4973 and the bipolar transistor Qs.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A bootstrap circuit in a DC/DC static converter including a power transistor having a first non drivable terminal coupled with a first input voltage; and driving means connected with a drivable terminal of the power transistor and adapted for determining the on time and the off time of the power transistor for each prefixed switching time period, the bootstrap circuit comprising:

a capacitor coupled respectively with a second non drivable terminal of the power transistor and with a second input voltage and an input of the driving means so that the voltage between its terminals is substantially equal to the voltage between the second non drivable terminal and the drivable terminal during the off time of the power transistor; and an overcharge circuit for overcharging the capacitor during the off time of the power transistor for a time period lower than the off time, the overcharge circuit being coupled between the second non drivable terminal and a reference voltage.

2. A bootstrap circuit in a DC/DC static converter including a power transistor having a first non drivable terminal coupled with a first input voltage; and driving means connected with a drivable terminal of the power transistor and adapted for determining the on time and the off time of the power transistor for each prefixed switching time period, the bootstrap circuit comprising:

a capacitor coupled respectively with a second non drivable terminal of the power transistor and with a second input voltage and an input of the driving means so that the voltage between its terminals is substantially equal to the voltage between the second non drivable terminal and the drivable terminal during the off time of the power transistor; and an overcharge circuit arranged between the second non drivable terminal and a reference voltage, the overcharge circuit being able to allow overcharging the capacitor during the off time of the power transistor for a time period lower than the off time, wherein the overcharge circuit comprises a series coupling of a resistor and a further transistor.

3. The bootstrap circuit in a DC/DC static converter according to claim 2, wherein the further transistor is a bipolar transistor.

4. The bootstrap circuit in a DC/DC static converter according to claim 2, wherein the transistor is a MOSFET transistor and the resistor is the on resistance of the MOSFET.

5. The bootstrap circuit in a DC/DC static converter according to claim 1, wherein the time period for overcharging the capacitor occurs close to the end of the off time.

6. The bootstrap circuit in a DC/DC static converter according to claim 1, wherein the capacitor is connected to the second input voltage through a diode, and is connected directly with the second non-drivable terminal of the power transistor.

7. The bootstrap circuit in a DC/DC static converter according to claim 2, wherein the driving means comprising another transistor which is controlled by an external PWM signal and which is adapted for determining the turning off of the power transistor.

8. The bootstrap circuit in a DC/DC static converter according to claim 7, wherein the further transistor of the overcharge circuit is controlled by a further external signal synchronized with the external PWM signal in order to determine the turning on of the further transistor for the time period for overcharging the capacitor which is lower than the off time.

9. The bootstrap circuit in a DC/DC static converter according to claim 2, wherein the first resistor has a value included in a range from 10 to 100 Ohm.

10. The bootstrap circuit in a DC/DC static converter according to claim 1, wherein the power transistor is a DMOS transistor, the first non-drivable terminal being the drain terminal of the DMOS transistor, the second non-drivable terminal being the source terminal of the DMOS transistor and the drivable terminal being the gate terminal of the DMOS transistor.

11. The bootstrap circuit in a DC/DC static converter according to claim 1, wherein the reference voltage is ground.

12. The bootstrap circuit in a DC/DC static converter according to claim 1, wherein the converter comprises an inductance coupled between the second non drivable terminal of the power transistor and an output terminal of the converter.

13. The bootstrap circuit in a DC/DC static converter according to claim 1, wherein the overcharge circuit comprises further transistor coupled between the second non drivable terminal of the power transistor and the reference voltage, the switch being controlled by a signal having a fixed frequency.

14. The bootstrap circuit in a DC/DC static converter according to claim 1, wherein the overcharge circuit overcharges the capacitor by forcing the voltage at the second non drivable terminal of the power transistor to go low during the off time of the power transistor for a time period lower than the off time.

15. A bootstrap circuit in a DC/DC static converter including a power transistor having a first non drivable terminal coupled with a first input voltage; and driving means connected with a drivable terminal of the power transistor and adapted for determining the on time and the off time of the power transistor for each prefixed switching time period, the bootstrap circuit comprising;
  a capacitor coupled respectively with a second non drivable terminal of the power transistor and with a second input voltage and an input of the driving means so that the voltage between its terminals is substantially equal to the voltage between the second non drivable terminal and the drivable terminal during the off time of the power transistor; and
  an overcharge circuit arranged between the second non drivable terminal and a reference voltage, the overcharge circuit being able to allow overcharging the capacitor during the off time of the power transistor for a time period lower than the off time,
  wherein the converter comprises an inductance connected between the second non drivable terminal of the power transistor and an output terminal of the converter, a freewheeling diode connected between the non drivable terminal of the power transistor and ground which is adapted for demagnetising the inductance during the off time of the power transistor, the time period for overcharging the capacitor occurring after the period time for demagnetising the inductance.

16. A device including at least one bootstrap circuit in a DC/DC static converter including a power transistor having a first non drivable terminal coupled with a first input voltage; and driving means connected with a drivable terminal of the power transistor and adapted for determining the on time and the off time of the power transistor for each prefixed switching time period, the bootstrap circuit comprising:
  a capacitor coupled respectively with a second non drivable terminal of the power transistor and with a second input voltage and an input of the driving means so that the voltage between its terminals is substantial equal to the voltage between the second non drivable terminal and the drivable terminal during the off time of the power transistor; and
  an overcharge circuit for overcharging the capacitor during the off time of the power transistor for a time period lower than the off time, the overcharge circuit being coupled between the second non drivable terminal and a reference voltage.

17. The device according to claim 16, wherein the time period for overcharging the capacitor occurs close to the end of the off time.

18. The device according to claim 16, wherein the capacitor is coupled with the second input voltage by a diode and is connected directly with the second non-drivable terminal of the power transistor.

19. A device including at least one bootstrap circuit in a DC/DC static converter including a power transistor having a first non drivable terminal coupled with a first input voltage; and driving means connected with a drivable terminal of the power transistor and adapted for determining the on time and the off time of the power transistor for each prefixed switching time period, the bootstrap circuit comprising;
  a capacitor coupled respectively with a second non drivable terminal of the power transistor and with a second input voltage and an input of the driving means so that the voltage between its terminals is substantially equal to the voltage between the second non drivable terminal and the drivable terminal during the off time of the power transistor; and
  an overcharge circuit arranged between the second non drivable terminal and a reference voltage, the overcharge circuit being able to allow overcharging the capacitor during the off time of the power transistor for a time period lower than the off time,
  wherein the overcharge circuit comprises a series coupling of a resistor and a further transistor.

20. The device according to claim 19, wherein the further transistor is a bipolar transistor.

21. The device according to claim 19, wherein the transistor is a MOSFET transistor and the resistor is the on resistance of the MOSFET.

22. The device according to claim 19, wherein the driving means comprising another transistor which is controlled by an external PWM signal and which is adapted for determining the turning off of the power transistor.

* * * * *

UNITED STATES PATENT AND TRADEMARK OFFICE
CERTIFICATE OF CORRECTION

| | |
|---|---|
| PATENT NO. | : 6,798,269 B2 |
| APPLICATION NO. | : 10/337935 |
| DATED | : September 28, 2004 |
| INVENTOR(S) | : Ugo Moriconi et al. |

It is certified that error appears in the above-identified patent and that said Letters Patent is hereby corrected as shown below:

Column 9, Lines 20-21, change "comprises further" to --comprises a further--

Signed and Sealed this

Eighth Day of January, 2008

JON W. DUDAS
*Director of the United States Patent and Trademark Office*